(12) United States Patent
Yamada et al.

(10) Patent No.: US 8,420,529 B2
(45) Date of Patent: Apr. 16, 2013

(54) COPPER WIRING SURFACE PROTECTIVE LIQUID AND METHOD FOR MANUFACTURING SEMICONDUCTOR CIRCUIT

(75) Inventors: Kenji Yamada, Tokyo (JP); Kenji Shimada, Tokyo (JP); Hiroshi Matsunaga, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 64 days.

(21) Appl. No.: 13/119,539

(22) PCT Filed: Sep. 2, 2009

(86) PCT No.: PCT/JP2009/065320
§ 371 (c)(1),
(2), (4) Date: Jun. 16, 2011

(87) PCT Pub. No.: WO2010/032616
PCT Pub. Date: Mar. 25, 2010

(65) Prior Publication Data
US 2011/0237071 A1 Sep. 29, 2011

(30) Foreign Application Priority Data
Sep. 19, 2008 (JP) .................................. 2008-240671

(51) Int. Cl.
*H01L 21/28* (2006.01)

(52) U.S. Cl.
USPC ...... 438/633; 438/687; 568/852; 106/287.26; 257/E21.3; 257/E21.304; 257/E21.582

(58) Field of Classification Search .................. 438/633, 438/687; 568/852; 257/E21.3, E21.304, 257/E21.582; 106/287.26
See application file for complete search history.

(56) References Cited

U.S. PATENT DOCUMENTS

| | | | | |
|---|---|---|---|---|
| 5,928,993 | A * | 7/1999 | Johansson | ..................... 504/365 |
| 7,700,489 | B2 | 4/2010 | Matsui et al. | |
| 7,816,312 | B2 | 10/2010 | Oowada et al. | |
| 2004/0152308 | A1 * | 8/2004 | Minamihaba et al. | ........ 438/687 |
| 2005/0050803 | A1 | 3/2005 | Amanokura et al. | |
| 2006/0243702 | A1 | 11/2006 | Minamihaba et al. | |
| 2007/0232197 | A1 | 10/2007 | Amanokura et al. | |
| 2010/0099260 | A1 * | 4/2010 | Matsumoto et al. | .......... 438/693 |
| 2010/0134572 | A1 * | 6/2010 | Satoh et al. | ...................... 347/85 |
| 2011/0069114 | A1 * | 3/2011 | Ikoshi et al. | .................... 347/28 |
| 2011/0237071 | A1 * | 9/2011 | Yamada et al. | ............... 438/653 |
| 2012/0129982 | A1 * | 5/2012 | Zipplies et al. | ................. 524/58 |
| 2012/0236068 | A1 * | 9/2012 | Matsushita | .................... 347/20 |

FOREIGN PATENT DOCUMENTS

| | | |
|---|---|---|
| JP | 09 302325 | 11/1997 |
| JP | 10 008278 | 1/1998 |
| JP | 2000 162788 | 6/2000 |
| JP | 2002 164315 | 6/2002 |
| JP | 2006 310596 | 11/2006 |
| JP | 2008 199036 | 8/2008 |

OTHER PUBLICATIONS

Internatioanl Search Report Issued Oct. 6, 2009 in PCT/JP09/065320 filed Sep. 2, 2009.
U.S. Appl. No. 13/062,365, filed Mar. 4, 2011, Yamada, et al.

* cited by examiner

Primary Examiner — George Fourson, III
(74) Attorney, Agent, or Firm — Oblon, Spivak, McClelland, Maier & Neustadt, L.L.P.

(57) ABSTRACT

A copper wiring material surface protective liquid for production of a semiconductor device is provided, containing an oxyalkylene adduct of an acetylenediol containing an acetylenediol having an oxyalkylene having 2 or 3 carbon atoms added thereto. A method for producing a semiconductor circuit device is provided, containing: forming an insulating film and/or a diffusion preventing film on a silicon substrate; then forming a copper film by a sputtering method; then forming a copper wiring containing 80% by mass or more of copper thereon by a plating method; and flattening the wiring by a chemical mechanical polishing (CMP) method, thereby providing a semiconductor substrate containing a copper wiring, the semiconductor substrate having an exposed surface of a copper wiring material being treated by making in contact with the copper wiring material surface protective liquid.

6 Claims, No Drawings

COPPER WIRING SURFACE PROTECTIVE LIQUID AND METHOD FOR MANUFACTURING SEMICONDUCTOR CIRCUIT

TECHNICAL FIELD

The present invention relates to a copper wiring surface protective liquid for protecting a copper wiring surface from contamination, corrosion, oxidation and occurrence of foreign matters, which are derived from the production process of a semiconductor circuit device and the environment, thereby providing a clean copper wiring surface, and to a method for producing a semiconductor circuit using the same.

BACKGROUND ART

A lithography method has been employed as a production method of a semiconductor circuit device. In the case where a semiconductor circuit device is produced by the lithography method, a conductor thin film layer, such as a metal film, used as a conductor wiring material, and an interlayer insulating film, such as a silicon oxide film, for insulating among the conductor thin film layers and the wiring are formed on a semiconductor substrate, such as a silicon wafer. Thereafter, a photoresist is coated uniformly on the surface thereof to provide a photosensitive layer, which is then subjected to selective exposure and development, thereby forming a desired resist pattern. The thin films in the lower layer part are subjected to a selective etching treatment with the resist pattern as a mask, thereby forming a desired wiring pattern on the thin films, and then the resist pattern used as a mask is removed, whereby the semiconductor circuit device is produced.

The increase in integration degree of a semiconductor circuit device requires miniaturization in dimensions of patterning process. Associated thereto, a dry etching method using etching gas is becoming mainstream for the aforementioned selective etching treatment. An alloy containing aluminum as a major component, which has been used as the circuit wiring and the electrode material, has a resistance that is too high for the wiring material of the highly integrated semiconductor circuit device, and there may be problems, such as decrease in circuit response speed due to wiring delay, increase in generated heat amount, and electromigration due to increase in electric current density. For solving the problems, a wiring material using copper or an alloy containing 80% by mass or more of copper (which will be hereinafter referred to as a copper wiring material), which has a small electric resistance and is excellent in migration characteristics as compared to the alloy containing aluminum as a major component, is being widely developed and employed.

However, there are problems that copper useful as a wiring material is difficult to be subjected to the selective etching by the dry etching method using etching gas, and upon making in contact with an insulating material, such as an interlayer insulating film, copper in the copper wiring material is diffused into the insulating material, thereby impairing the insulating property thereof. Furthermore, the copper wiring material is liable to be oxidized to form an oxide on the surface thereof, and is liable to be corroded in an aqueous solution on wet etching, rinsing or the like, and thus the copper wiring material is necessarily handled with care.

In the case where copper or a copper alloy containing 80% by mass or more of copper is used as a wiring material, it is necessary to use a wiring formation technique that does not employ a dry etching method using etching gas. Accordingly, a wiring formation technique referred to as a damascene method is employed, in which a trench in the form of the wiring is formed in an interlayer insulating film, in which a metal, such as a copper wiring material, is filled.

For preventing diffusion of copper contained in the copper wiring material into the insulating material, which lowers the insulating property thereof, a procedure is necessarily employed in that the copper wiring is covered with a film that prevents copper from being diffused (which will be hereinafter referred to as a diffusion preventing film). The diffusion preventing film is disposed between the copper wiring material and the insulating material in view of the function thereof. Examples of the formation method therefor employed include a method, in which an insulating material, such as an interlayer insulating film, having been formed into a desired shape is covered with a diffusion preventing film, which is generally referred to as a barrier layer or a barrier metal, formed by a film formation method, such as a sputtering method and a CVD method (a chemical vapor deposition method), and then a copper wiring material is formed thereon, and a method, in which a copper wiring material is formed on a semiconductor substrate by a plating method, and then flattened by a chemical mechanical polishing method (which will be hereinafter referred to as a CMP method) for removing an excessive copper wiring material and flattening the surface of the copper wiring, and then the copper wiring is covered with a diffusion preventing film, which is generally referred to as a cap layer, i.e., a cap metal, formed by a sputtering method, a CVD method or the like. In any of these methods, the diffusion preventing film is formed and is in contact with the surface of the copper wiring material. The copper wiring material that is to be covered with the diffusion preventing film, which is referred to as a barrier layer, a barrier metal, a cap layer or a cap metal, is in an exposed state before covering with the diffusion preventing film. The copper in the exposed state is easily oxidized with oxygen in the air, and an oxide layer is formed on the surface of the copper wiring material before covering with the diffusion preventing film. While depending on the waiting time until the step of forming the diffusion preventing film, the exposed surface of the copper wiring material may be considerably oxidized to form foreign matters, or may suffer formation of contamination, corrosion and foreign matters derived from the production environment. Upon limiting the waiting time until the step of forming the diffusion preventing film for avoiding the problems, disadvantages on productivity and economy may occur due to complicated procedures.

Specific examples of the step where the surface of the copper wiring material is exposed include a wiring formation step by the damascene method, in which an interlayer insulating film or a diffusion preventing film is etched to form a trench in the form of the wiring, and a copper wiring material is then filled in the trench. Examples of the cases where the surface of the copper wiring material is exposed in the step include the following cases (1) and (2).

(1) The surface of the copper wiring material as a lower layer is exposed in the step, in which an interlayer insulating film or a diffusion preventing film (a cap metal) is etched to reach the copper wiring material as the lower layer for achieving electric conduction.

(2) After forming by a plating method a diffusion preventing film (a barrier metal) or a copper wiring material in the trench in the form of the wiring formed in the case (1), the surface of the copper wiring material is exposed in the step of flattening by a CMP method.

The cases (1) and (2) include a cleaning step with a cleaning liquid, a rinsing step with extra pure water and a drying step, and in these steps, changes and modifications of the state of the surface of the copper wiring material, i.e., oxidation and corrosion of the surface of the copper wiring material, may occur.

Specifically, in the case where a dry etching process is used in the step of etching the interlayer insulating film for forming the trench in the form of the wiring, i.e., the case (1), a residue derived from the dry etching gas, the resist, the film to be processed, the materials of the members inside the dry etching chamber, and the like (which will be hereinafter referred to as an etching residue) is formed. The etching residue existing is not preferred since it causes such phenomena as an increased resistance, an electric short circuit, and the like. For removing the etching residue, in general, there is such a process that the surface is cleaned with a cleaning liquid, and immediately after cleaning, the cleaning liquid is rinsed out with an organic solvent or extra pure water. In the case where the cleaning liquid exhibits alkalinity, it may be rinsed with carbonated water for neutralizing the alkalinity. In the case of a cleaning step by a spin spraying method achieved with a single substrate cleaning device(a single-wafer type cleaning device) or the like, the rinsing step may be performed with carbonated water instead of extra pure water for preventing static charge of the semiconductor substrate.

In the process where a copper wiring material is formed by a plating method, and then the surface thereof is flattened by CMP, i.e., the case (2), the surface of the copper wiring material formed by a plating method is polished with a slurry containing polishing particles, such as cerium oxide, and a polishing pad (i.e., the CMP process) for providing the desired thickness, flatness and wiring pattern, and then excessive copper thus ground, the polishing particles remaining on the surface of the copper wiring material thus polished, and the like are removed by cleaning. The cleaning process includes a rinsing step with extra pure water or carbonated water. Not only carbonated water, but also extra pure water in this case exhibit weak acidity through absorption of carbon dioxide in the air. The rinsing with the weakly acidic water easily corrodes the surface of the copper wiring material. In the drying step after rinsing, such methods are employed as a method of spinning the semiconductor substrate for draining water and drying, blowing air onto the spinning semiconductor substrate for draining water and drying, and a method of drying the substrate with hot air or steam, but there are cases where the surface of the copper wiring material is oxidized or modified depending on the drying method. Even when the surface of the copper wiring material can be prevented from being oxidized or modified in the drying step, the surface of the copper wiring material is exposed until the subsequent step of forming a diffusion preventing film, and may be easily oxidized with oxygen in the air, thereby forming an oxide layer on the surface of the copper wiring material. The surface of the copper wiring material may be considerably oxidized to form foreign matters, or may suffer formation of contamination, corrosion and foreign matters derived from the production environment.

The copper wiring material thus modified through corrosion or oxidation is not desirable since it may cause increase in electric resistance, decrease in adhesion to the diffusion preventing film, occurrence of voids, and the like. With the progress of miniaturization in recent years, slight modification, e.g., minute corrosion, minute increase in thickness of the oxide film, and minute foreign matters, that has been permitted may cause great influence on the performance of the semiconductor device, which brings about a significant problem of defective products. For avoiding the problem of defective products, it is important to maintain clean the surface state of copper or a copper alloy containing 80% by mass or more of copper.

In the case involving the problem of modification, such as oxidation, corrosion and foreign matters, on the surface of the copper wiring material in the cleaning step, a metal modification preventing method has been known in that a deoxidizing agent removing dissolved oxygen, a corrosion preventing agent, a passive film forming agent or the like is used in the water rinsing step. It has been also known in the drying step that a vacuum drying method or a drying method performed in a nitrogen atmosphere is employed for preventing modification on the surface of copper. While examples of the deoxidizing agent used for removing dissolved oxygen in the water rinsing step include a reducing agent, such as hydrazine, hydroxylamine, sodium sulfite and sodium bisulfite, the deoxidizing agent can prevent the surface of the copper wiring material from being oxidized or modified in water upon rinsing with water, but fails to prevent completely the surface of the copper wiring material from being oxidized or modified upon drying and after drying. Furthermore, oxidation or modification on the surface of the copper wiring material is difficult to be avoided by employing a vacuum drying method or a drying method performed in a nitrogen atmosphere in the drying step unless the surface of the copper wiring material is not exposed, and moreover, a vacuum drying method and a drying method performed in a nitrogen atmosphere require high cost for equipments with low workability and are disadvantageous in cost due to nitrogen used in a large amount.

As a copper surface protective film, Patent Documents 1 to 3 disclose a pre-drying treating liquid containing acetylene alcohol with a hydroxylamine compound, a hydrazine compound or an alkylalcohol, and disclose that a metal surface free of unevenness and stain (discoloration) is obtained by suppressing oxidation in a drying step. However, some kinds of metals are easily oxidized, and problems may occur in prevention of corrosion on rinsing with pure water exhibiting weak acidity used in a production process of a semiconductor circuit device, and in a surface of a copper wiring material exposed during a waiting time from a drying step to a subsequent step.

Patent Documents 4 to 6 propose the use of an acetylene alcohol compound, an acetylene diol compound, and ethylene oxide or propylene oxide thereof mixed in an organic acid, and a developer liquid, a separating liquid, a cleaning liquid and a rinsing liquid therefor, or a CMP slurry used in a production process of a semiconductor. However, they cannot prevent occurrence of contamination, corrosion and foreign matters derived from the production environment, formed on the surface of the copper wiring material in the production process of a semiconductor circuit device or the like.

Furthermore, for preventing failure of a semiconductor device caused by oxidation or modification of an exposed copper surface, there is a method for suppressing oxidation or modification of the copper surface by preventing the metal from being in contact with the air (e.g., oxygen) with a modification preventing agent or an anticorrosion agent attached to the copper surface. Patent Document 4 discloses as conventional art the use of benzotriazole (which will be hereinafter abbreviated as BTA) as an anticorrosion agent for copper in a photoresist separating liquid used in a production process of a semiconductor circuit device containing copper wiring. The use of an amine compound or a triazole compound, such as BTA, forms a complex compound of the compound with copper on the surface of copper, thereby failing to provide a clean copper surface. The anticorrosion agent present on the copper surface is not desirable since it may cause increase in electric resistance, decrease in adhesion to the diffusion preventing film, occurrence of voids, and the like, as similar to modified copper. The use of a triazole compound or the like with low solubility in water is not desirable since the compound remains on the wafer surface even after rinsing with water, thereby providing adverse affect on the subsequent process. Moreover, a triazole compound, such as BTA, is poor in biodegradability and thus provide a large load on waste liquid processing.

As described hereinabove, for producing a highly integrated and highly miniaturized semiconductor circuit device with high accuracy and high quality, it is significantly important to form a diffusion preventing film while maintaining a clean surface of a copper wiring material. Accordingly, such a technique is demanded that in production of a semiconductor circuit device, a surface of a copper wiring material is protected from modification, such as corrosion and oxidation, and contamination derived from the production environment, thereby maintaining the surface clean, during the period of from a step of exposing the surface of the copper wiring material, e.g., a step of forming a trench in the form of wiring reaching the copper wiring material in an interlayer insulating film to expose the surface of the copper wiring material, and a step of flattening by CMP a surface of copper or a copper alloy formed by a plating method to expose the surface of the copper wiring material, to a step of forming a diffusion preventing film.

RELATED ART DOCUMENTS

Patent Documents

Patent Document 1: JP-A-09-302325
Patent Document 2: JP-A-10-8278
Patent Document 3: JP-A-2002-164315
Patent Document 4: JP-A-2000-162788
Patent Document 5: JP-A-2005-109452
Patent Document 6: JP-A-2006-251491

SUMMARY OF THE INVENTION

Problems to be Solved by the Invention

An object of the present invention is to provide such a copper wiring material surface protective liquid that in production of a semiconductor circuit device, a surface of a copper wiring material is protected from modification, such as corrosion, oxidation and occurrence of foreign matters, and contamination derived from the production environment, which occur during the steps of cleaning, rinsing with water and drying the exposed surface of the copper wiring material, and during a waiting time between the steps, immediately before a step of covering the copper wiring material with a diffusion preventing film, thereby providing a clean surface of the copper wiring material, and a method for producing a semiconductor circuit device using the same.

Means for Solving the Problems

As a result of earnest investigations made by the inventors, it has been found that the use of a copper wiring material surface protective liquid containing an aqueous solution containing an oxyalkylene adduct of an acetylenediol (the alkylene is constituted by 2 or 3 carbon atoms) effectively protects a surface of a copper wiring material from modification, such as corrosion, oxidation and occurrence of foreign matters, and contamination derived from the production environment, and a subsequent simple treatment provides a clean surface of the copper wiring material without the oxyalkylene adduct of an acetylenediol attached to the surface of the copper wiring material, and thus the present invention has been completed.

The present invention provides the following.

(1) A copper wiring material surface protective liquid for production of a semiconductor device, containing an oxyalkylene adduct of an acetylenediol containing an acetylenediol having an oxyalkylene having from 2 or 3 carbon atoms added thereto.

(2) The copper wiring material surface protective liquid according to the item (1), wherein the acetylenediol is 2,4,7,9-tetramethyl-5-decyn-4,7-diol and/or 2,5,8,11-tetramethyl-6-dodecyn-5,8-diol.

(3) The copper wiring material surface protective liquid according to the item (1), wherein a molar number of the oxyalkylene in the oxyalkylene adduct of an acetylenediol is from 1 to 10 mol.

(4) The copper wiring material surface protective liquid according to the item (1), wherein the oxyalkylene of the oxyalkylene adduct of an acetylenediol is oxyethylene, and a total number of carbon atoms of the oxyalkylene adduct of an acetylenediol is from 16 to 34.

(5) The copper wiring material surface protective liquid according to the item (1), which further contains at least one kind of an alcohol compound and a glycol ether compound.

(6) A method for producing a semiconductor circuit device, containing; forming an insulating film and/or a diffusion preventing film on a silicon substrate; then forming a copper film by a sputtering method; then forming a copper wiring containing 80% by mass or more of copper thereon by a plating method; and flattening the copper wiring by a chemical mechanical polishing (CMP) method, thereby providing a semiconductor substrate containing a copper wiring, the semiconductor substrate having an exposed surface of a copper wiring material being treated by making in contact with the copper wiring material surface protective liquid according to one of the items (1) to (5).

According to the present invention, such a copper wiring material surface protective liquid is provided that in production of a semiconductor circuit device, a surface of a copper wiring material is protected from modification, such as corrosion, oxidation and occurrence of foreign matters, and contamination derived from the production environment, which occur during the steps of cleaning, rinsing with water and drying the exposed surface of the copper wiring material, and during a waiting time between the steps, immediately before a step of covering the copper wiring material with a diffusion preventing film, thereby providing a clean surface of the copper wiring material, and a method for producing a semiconductor circuit device using the same is also provided.

EMBODIMENTS FOR CARRYING OUT THE INVENTION

1. Copper Wiring Material Surface Protective Liquid

The copper wiring material surface protective liquid for production of a semiconductor device of the present invention contains an oxyalkylene adduct of an acetylenediol containing an acetylenediol having an oxyalkylene having 2 or 3 carbon atoms added thereto (which may be hereinafter referred to as an oxyalkylene adduct of an acetylenediol).

In the present invention, an exposed surface of a copper wiring material in production of a semiconductor circuit device is treated by making in contact with the copper wiring material surface protective liquid of the present invention (contact treatment) before rinsing with water, rinsing with carbonated water and making the surface in contact with the air or the production environment atmosphere and the like, which cause modification, such as corrosion and oxidation, on the exposed surface of the copper wiring material.

It is considered that according to the liquid contact treatment, the exposed surface of the copper wiring material adsorbs the oxyalkylene adduct of an acetylenediol chemically or physically. It is considered that the presence of the adsorbed component (i.e., the oxyalkylene adduct of an acetylenediol) protects the surface of the copper wiring material from the factors causing the modification, such as corrosion and oxidation. The adsorbed component can be easily removed by a predetermined treatment, and therefore, by removing the adsorbed component immediately before the step of covering the copper wiring material with a diffusion preventing film, the diffusion preventing film can be formed on a clean surface of the copper wiring material without modification or the like.

Examples of the occasions where the copper wiring material surface protective liquid of the present invention is used in a production process of a semiconductor circuit device include the following. The protective liquid may be used, for example:

(1) after forming a copper wiring material on a semiconductor substrate by a plating method, (2) after polishing the surface of the copper wiring material for providing the desired thickness, flatness and wiring pattern of the copper wiring material by CMP with a slurry containing polishing particles, such as cerium oxide, aluminum oxide and silicon oxide, and a polishing pad, (3) after cleaning by removing excessive copper ground by CMP, the polishing particles remaining on the polished surface of the copper wiring material, and the like, and (4) in a wiring formation process by a damascene method, after forming a trench in the form of the wiring for embedding a copper wiring material in an interlayer insulating film as an insulating film material, for example, by a dry etching method, and cleaning with a cleaning liquid an etching residue formed on etching.

In each of the cases, preceding the drying, rinsing with water or rinsing with carbonated water, the semiconductor substrate having an exposed surface of the copper wiring material is treated by making in contact with the copper wiring material surface protective liquid, followed by drying. According to the procedures, the oxyalkylene adduct of an acetylenediol is adsorbed on the surface of the copper wiring material as an adsorbed component, which protects the surface of the copper wiring material from modification, such as corrosion, oxidation and foreign matters, and contamination derived from the production environment, not only during the process steps but also after drying, and is conveniently removed from the surface of the copper wiring material by depressurizing, heating or the like in the subsequent formation of a diffusion preventing film, thereby providing a clean surface of the copper wiring material.

A step of rinsing with water or rinsing with carbonated water may be provided after the liquid contact treatment.

Examples of the acetylenediol in the present invention include 2,4,7,9-tetramethyl-5-dcyn-4,7-diol, 2,5,8,11-tetramethyl-6-dodecyn-5,8-diol, 2-butyn-1,4-diol, 3,6-dimethyl-4-octyn-3,6-diol and 3-hexyn-2,5-diol, and particularly preferred examples thereof include 2,4,7,9-tetramethyl-5-decyn-4,7-diol and/or 2,5,8,11-tetramethyl-6-dodecyn-5,8-diol.

Examples of the oxyalkylene compound having 2 or 3 carbon atoms in the present invention include ethylene oxide (oxyethylene) and propylene oxide (oxypropylene), and particularly preferred examples thereof include ethylene oxide.

The addition ratio of the oxyalkylene compound in the oxyalkylene adduct of an acetylenediol is preferably from 1 to 10 mol, more preferably from 2 to 10 mol, and further preferably from 4 to 10 mol, of the oxyalkylene compound per 1 mol of the acetylenediol.

When the ratio of the oxyalkylene compound is from 1 to 10 mol, the oxyalkylene adduct of an acetylenediol has increased hydrophilicity, which facilitates dissolution in water or a solvent, and thus can be favorably used.

The total number of carbon atoms of the oxyalkylene adduct of an acetylenediol is preferably from 16 to 34, and more preferably from 22 to 34. When the total number of carbon atoms is from 16 to 34, the oxyalkylene adduct of an acetylenediol does not have too high viscosity, which impairs the handleability, and has good balance between hydrophilicity and hydrophobicity, which facilitates dissolution in water or a solvent, and thus the oxyalkylene adduct of an acetylenediol has good handleability and can be favorably used as a copper wiring material surface protective liquid.

The concentration of the oxyalkylene adduct of an acetylenediol in the present invention may be appropriately determined in consideration of the protection effect, the solubility in water, and the like thereof, and is preferably from 0.001 to 3% by mass in view of balance between the economy and the advantage. Further taking the economy, the copper surface protective effect and the like into consideration, the concentration of the oxyalkylene adduct of an acetylenediol is more preferably from 0.005 to 2% by mass, and more preferably from 0.01 to 1% by mass.

The solvent used in the present invention is preferably water, and in addition thereto, an alcohol compound and a glycol ether compound may be appropriately mixed therewith.

Preferred examples of the alcohol compound include an alcohol having from 1 to approximately 10 carbon atoms, and methanol, ethanol and isopropanol are particularly preferred.

Preferred examples of the glycol ether compound include a monoalkyl ether and a dialkyl ether of ethylene glycol, diethylene glycol, triethylene glycol, propylene glycol, dipropylene glycol, tripropylene glycol and the like. Among these, a diethylene glycol monoalkyl ether, a diethylene glycol dialkyl ether, a dipropylene glycol monoalkyl ether, a dipropylene glycol dialkyl ether and the like are preferred, and preferred examples thereof specifically include diethylene glycol monomethyl ether, diethylene glycol monobutyl ether and dipropylene glycol monomethyl ether.

It is effective to use an organic solvent, such as an amide and dimethylsulfoxide, in addition to the alcohol compound and the glycol ether compound, for enhancing the drying efficiency upon drying. Examples of the amide include N,N-dimethylformamide, N,N-dimethylacetamide and N-methyl-2-pyrrolidone. However, the solvent is not limited to these compounds. In addition to the above, an acid, an alkali, an organic solvent, a chelating agent, an additive and the like that are ordinarily used in production of a semiconductor circuit device may be mixed therein depending on necessity in such a range that does not impair the advantages of the present invention.

The concentration of the solvent in the aqueous solution is preferably from 1 to 80% by mass, more preferably from 3 to 50% by mass, and further preferably from 5 to 30% by mass.

As the treatment apparatus and the treating method for performing the treatment with the copper wiring material surface protective liquid of the present invention, a treatment apparatus and a treating method that are used for producing a semiconductor circuit device may be used. For example, a batch process using an immersion type treatment apparatus, a spin spraying treatment apparatus where the copper wiring material surface protective liquid of the present invention is sprayed on a rotating semiconductor substrate, and a single substrate treatment apparatus (a single-wafer type treatment apparatus) may be used.

Examples of the case where the liquid contact treatment is performed by using an immersion type treatment apparatus include a method, in which a semiconductor substrate having an exposed copper wiring material, which has been subjected to the preceding treatment (e.g., after subjecting a plated copper film to CMP, after performing CMP and cleaning, after subjecting an insulating film to dry etching and cleaning a dry etching residue, or the like) is immersed in a liquid contact treatment bath having the copper wiring material surface protective liquid of the present invention housed therein, and after lapsing a predetermined period of time, the substrate is taken out from the liquid contact treatment bath and then immersed in a rinsing bath, followed by drying.

In this case, the copper wiring material surface protective liquid housed in the liquid contact treatment bath may be fed from the bottom part of the bath and recycled through overflow from the upper part of the bath, may be subjected to the liquid contact treatment without circulation but being accumulated in the treatment bath, may be subjected to a multi-stage liquid contact treatment with plural liquid contact treatment baths, may be subjected to the liquid contact treatment while vibrating a semiconductor substrate or a holding device therefor in the liquid contact treatment bath, or may be subjected to the treatment under application of ultrasonic wave, and these cases may be selected appropriately depending on the specification of the liquid contact treatment apparatus.

The rinsing bath may also be operated by an overflow system where extra pure water or the like is fed from the bottom part of the rinsing bath and overflows from the upper part of the bath, a multi-stage liquid contact treatment with plural rinsing baths, or a quick dump system where the semiconductor substrate is placed in a rinsing bath having rinsing water, such as extra pure water, and then the rinsing water is repeatedly withdrawn from the bottom part of the rinsing bath and then accumulated in the rinsing bath, and when the rinsing water is accumulated in the rinsing bath in the quick dump system, the rinsing water may be fed by spraying to rinse the semiconductor substrate. These methods may be appropriately selected depending on the specification of the treatment apparatus.

As a method for drying the semiconductor substrate, which has been subjected to the liquid contact treatment with the copper wiring material surface protective liquid and then rinsed, after withdrawing from the rinsing bath, a method of draining the rinsing water by rotation, a method of drying with hot air, or a method of using an organic solvent with good drying property, such as isopropyl alcohol, may be selected appropriately depending on the specification of the treatment apparatus.

In the case where a spin spraying type apparatus is used, it is preferred that while a semiconductor substrate is disposed substantially vertically in a chamber and is rotated, a cleaning step is performed by feeding a cleaning liquid by spraying on the semiconductor substrate from above, and then the copper wiring material surface protective liquid of the present invention is similarly fed by spraying on the semiconductor substrate under rotation. In the subsequent rinsing step, as similar to the above, rinsing water, such as extra pure water, may be fed and sprayed onto the semiconductor substrate under rotation, and the subsequent drying may be performed by rotating the semiconductor substrate at a high speed to drain the liquid or feeding heated nitrogen or air to the chamber while rotating the semiconductor substrate.

In the case of using the single substrate treatment apparatus, it is preferred that a semiconductor substrate disposed horizontally is subjected to cleaning with a cleaning liquid, a CMP treatment and cleaning after CMP, and then the copper wiring material surface protective liquid of the present invention is fed to the rotating semiconductor substrate from above. Examples of the method of feeding the copper wiring material surface protective liquid of the present invention in this case include a method, in which the feeding nozzle for feeding the protective liquid is disposed not only at the center of the semiconductor substrate but also at a position deviated from the center, a method of feeding the protective liquid from the feeding nozzle moving on the semiconductor substrate, a method of feeding the aqueous solution or the like while changing the rotation number of the semiconductor substrate, and a method of accumulating the cleaning liquid or the rinsing water on the semiconductor substrate by stopping the rotation of the semiconductor substrate. The rinsing treatment may be performed, as similar to the above, by a method of feeding the rinsing water, such as extra pure water, to the rotating semiconductor substrate from above, and the aforementioned methods may be similarly employed. Examples of the drying method include a method of draining the liquid by rotating the semiconductor substrate at a high speed, and a method of blowing off the liquid by feeding nitrogen or the air to the semiconductor substrate. The rotation number of the semiconductor substrate, the amount of the liquid fed, and recycled use or one-time use of the aqueous solution or the like in these treatments may be appropriately determined depending on the specification of the treatment apparatus used.

The liquid contact treatment time with the copper wiring material surface protective liquid of the present invention is not particularly limited and may be appropriately determined depending on the treatment apparatus and the treating method. The liquid contact treatment time is practically preferably from 5 to 1,000 seconds, more preferably from 5 to 900 seconds, and further preferably from 5 to 600 seconds. When the treatment time is 5 seconds or more, the effect of the liquid contact treatment can be obtained sufficiently. The treatment time is suitably 1,000 seconds or less from the standpoint of productivity and economy.

For example, in the case of the batch treatment using an immersion type treatment apparatus or a spin spraying treatment apparatus, the liquid contact treatment time may be set at approximately 600 seconds from the standpoint that plural semiconductor substrates may be subjected to the treatment simultaneously in one liquid contact treatment bath, and the standpoint of operability of the treatment apparatus.

In the case using the single substrate treatment apparatus, the liquid contact treatment time may be set at from 5 to 120 seconds from the standpoint that semiconductor substrates are subjected one by one to the treatment in one liquid contact treatment bath, and the standpoint that the liquid contact treatment time can be managed by second in this treatment system.

The temperature of the aqueous solution, the temperature of the semiconductor substrate, the temperature of the treatment atmosphere and the like in the treatment are not particularly limited, and the temperatures are preferably from 5 to 50° C., more preferably from 10 to 40° C., and further preferably from 20 to 30° C., from the standpoint of prevention of oxidation and modification of the surface of the copper wiring material. The treatment atmosphere is preferably an atmosphere containing no oxygen, such as a nitrogen atmosphere, which may be appropriately determined in consideration of productivity, economy and the specification of the treatment apparatus used.

Upon using the copper wiring material protective liquid, the following conditions are preferably satisfied. The temperature, at which the adsorbed component is desorbed after the liquid contact treatment, is preferably from 40 to 400° C., more preferably from 80 to 350° C., and further preferably from 100 to 300° C. When the temperature is 40° C. or more, the protection effect with the copper wiring material surface protective liquid can be maintained to the sufficient state, and when the temperature is 400° C. or less, the semiconductor circuit device can be prevented from suffering damages.

The pressure, at which the component in the copper wiring material surface protective liquid of the present invention is desorbed from the surface of the copper wiring material, may be an ordinary pressure or a reduced pressure and may be determined depending on the treating method and the treatment apparatus without particular limitation. The reduced pressure is preferably high vacuum of $1 \times 10^{-5}$ Pa or less. When the reduced pressure is employed, there are cases where high cost is required for equipments of the treatment apparatus.

The pressure is practically preferably from an ordinary pressure to $1 \times 10^{-8}$ Pa, more preferably from an ordinary pressure to $1 \times 10^{-7}$ Pa, and further preferably from an ordinary pressure to $1 \times 10^{-5}$ Pa, while depending on the process and the specification of the apparatus used for desorbing.

The semiconductor circuit device to be treated in the present invention has an exposed surface of a copper wiring material and may have other members therewith. Examples of the members constituting the semiconductor circuit device include a substrate material, such as silicon, amorphous silicon, polysilicon and glass, and materials accumulated thereon, for example, a wiring material, such as silicon oxide, silicon nitride, silicon carbide, tetraethoxysilane (which will be hereinafter referred to as TEOS), titanium, titanium nitride, tantalum, tantalum nitride, ruthenium, cobalt, copper, tungsten, and derivatives and alloys thereof, and an insulating material. A compound semiconductor, such as gallium-arsenic, gallium-phosphorus and indium-phosphorus, and an oxide semiconductor, such as chromium oxide, that have an exposed surface of a copper wiring material are also included.

2. Method for producing Semiconductor Circuit Device

In the method for producing a semiconductor circuit device of the present invention, an insulating film and/or a diffusion preventing film is formed on a silicon substrate, and is formed into a desired shape through a photolithograph step, a dry etching step and a cleaning step for removing a residue formed on dry etching. A copper film is formed thereon by a sputtering method, a copper wiring containing 80% by mass or more of copper is provided thereon by a plating method, which is then flattened by a chemical mechanical polishing (CMP) method, and the substrate is subjected to a cleaning step, such as post-CMP cleaning for removing the reagent used in the CMP step, thereby forming a copper wiring, a diffusion preventing film on an insulating film, and an insulating film. Thereafter, a photolithography step, a dry etching step, a cleaning step, a copper film forming step and the like are performed repeatedly, thereby providing a semiconductor substrate having a copper wiring. In these steps and between these steps, the semiconductor substrate having an exposed surface of the copper wiring material is subjected to the liquid contact treatment with the copper wiring material surface protective liquid of the present invention.

The conditions for the liquid contact treatment have been described above. The liquid contact treatment thus performed provides a semiconductor circuit device having a clean surface of a copper wiring material.

EXAMPLE

The present invention will be described specifically with reference to examples and comparative examples below. The present invention is not limited to the examples.

Production of Substrate Sample for Evaluation

On a silicon substrate, a TEOS (tetraethoxysilane) film having a thickness of 500 nm, a tantalum nitride film having a thickness of 10 nm and a tantalum film having a thickness of 20 nm were each formed in this order by a CVD method (chemical vapor deposition method). On the tantalum film thus formed, a copper film having a thickness of 100 nm was formed by a sputtering method, and then a plated copper film containing copper as a major component was formed by a plating method. The plated copper film was flattened by CMP to a thickness of 500 nm, thereby producing a semiconductor substrate, which was used as a substrate sample for evaluation.

The following evaluations were performed with the substrate sample for evaluation.

Evaluation 1: Evaluation of Corrosion with Carbonated Water

For evaluating the copper wiring material surface protective function, the substrate samples for evaluation were processed by the methods and conditions described in Examples and Comparative Examples, and then the substrate samples were immersed in extra pure water having carbon dioxide dissolved therein (specific resistance: 0.2 MΩ·cm, hereinafter referred to as carbonated water) at 25° C. for 5 minutes, and then dried by blowing nitrogen. The surface of the copper wiring material of the sample treated with carbonated water was observed with a high-resolution field-emission scanning electron microscope (hereinafter abbreviated as SEM). The results are shown in Table 1 below. The evaluation standard is as follows. A sample having corroded copper on the surface thereof (i.e., evaluated as B) was determined as poor protective function.

A: No corrosion observed on surface of copper wiring material

B: Corrosion observed on surface of copper wiring material

Evaluation 2: Evaluation on Exposure to High Humidity

For evaluating the modification preventing effect on the surface of the copper wiring material, the substrate samples for evaluation processed by the methods and conditions described in Examples and Comparative Examples were placed in a constant temperature and humidity chamber (IW221A, produced by Yamato Scientific Co., Ltd.) maintained at a temperature of 60° C. and a humidity of 60%, and exposed thereto for 4 hours. Thereafter, the surface of the sample was observed with SEM. The results are shown in Table 1 below. The evaluation standard is as follows. A sample having foreign matters formed on the copper surface (i.e., evaluated as B) was determined as poor modification preventing effect.

A: No foreign matter observed on surface of copper wiring material

B: Foreign matters observed on surface of copper wiring material

Evaluation 3: Evaluation of Desorption Property of Adsorbed Component

For confirming the desorption property of the adsorbed component from the surface of the copper wiring material, the substrates were subjected to heating or to heating and depressurization, and then immersed in carbonated water at 25° C. for 5 minutes, and the surface of the copper wiring material was observed with SEM. In the case where the adsorbed component is removed from the surface of the copper wiring material by subjecting the copper film to heating and depressurization, corrosion is observed on the surface of the copper wiring material after treating with carbonated water. Accordingly, a preferred results is that no corrosion of copper is found in Evaluation 1 but corrosion of copper is found in Evaluation 3. The results are shown in Table 1 below. The evaluation standard is as follows.

A: Corrosion observed on most of surface of copper wiring material

B: No corrosion observed on surface of copper wiring material

Example 1

The substrate sample for evaluation was subjected to liquid contact treatment (immersion) with a 1% by mass aqueous solution of a 10 mol oxyethylene adduct of 2,4,7,9-tetramethyl-5-decyn-4,7-diol (total carbon number: 34) at 25° C. for 120 seconds, and then rinsed with extra pure water.

The sample having been subjected to the liquid contact treatment was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment under a reduced pressure of $1 \times 10^{-7}$ Pa and 300° C. for 20 minutes, and then treated with carbonated water, and was observed with SEM. Corrosion was observed on the surface of the copper wiring material, which confirmed desorption of the adsorbed component.

Example 2

The substrate sample for evaluation was made in contact with a 1% hydrofluoric acid aqueous solution (hereinafter referred to as HF water) at 25° C. for 60 seconds for removing an oxide film on the surface of the copper wiring material, and then rinsed with extra pure water. Thereafter, the sample was subjected to liquid contact treatment with a 0.1% by mass aqueous solution of a 10 mol oxyethylene adduct of 2,4,7,9-tetramethyl-5-decyn-4,7-diol (total carbon number: 34) at 25° C. for 150 seconds, and then rinsed with extra pure water.

The sample was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1 \times 10^{-7}$ Pa and 250° C. for 10 minutes, and then treatment with carbonated water, and was observed with SEM. Corrosion was observed on the surface of the copper wiring material, which confirmed desorption of the adsorbed component.

Example 3

The substrate sample for evaluation was made in contact with 1% HF water at 25° C. for 60 seconds, and then rinsed with extra pure water. Thereafter, without blowing nitrogen, the sample was subjected to liquid contact treatment with a 1% by mass aqueous solution containing 50% by mass of isopropyl alcohol of a 4 mol oxyethylene adduct of 2,5,8,11-tetramethyl-6-dodecyn-5,8-diol (total carbon number: 24) at 25° C. for 180 seconds, and then rinsed with extra pure water.

The sample was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1 \times 10^{-7}$ Pa and 350° C. for 10 minutes, and then treatment with carbonated water, and was observed with SEM. Corrosion was observed on the surface of the copper wiring material, which confirmed desorption of the adsorbed component.

Example 4

The substrate sample for evaluation was subjected to liquid contact treatment with a 0.08% by mass aqueous solution of a 4 mol oxyethylene adduct of 2,5,8,11-tetramethyl-6-dodecyn-5,8-diol (total carbon number: 24) at 25° C. for 600 seconds, and then rinsed with extra pure water.

The sample was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1 \times 10^{-1}$ Pa and 400° C. for 10 minutes, and then treatment with carbonated water, and was observed with SEM. Corrosion was observed on the surface of the copper wiring material, which confirmed desorption of the adsorbed component.

Example 5

The substrate sample for evaluation was made in contact with 1% HF water at 25° C. for 60 seconds, then subjected to liquid contact treatment with a 0.5% by mass aqueous solution containing 50% by mass of methyl alcohol of a 4 mol oxyethylene adduct of 2,4,7,9-tetramethyl-5-decyn-4,7-diol (total carbon number: 22) at 25° C. for 120 seconds, and then rinsed with extra pure water.

The sample was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1\times10^{-7}$ Pa and 350° C. for 10 minutes, and then treatment with carbonated water, and was observed with SEM. Corrosion was observed on the surface of the copper wiring material, which confirmed desorption of the adsorbed component.

Example 6

The substrate sample for evaluation was subjected to liquid contact treatment with a 0.5% by mass aqueous solution containing 70% by mass of ethylene glycol of a 6 mol oxyethylene adduct of 2,4,7,9-tetramethyl-5-decyn-4,7-diol (total carbon number: 26) at 25° C. for 150 seconds, and then rinsed with extra pure water.

The sample was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1\times10^{-7}$ Pa and 300° C. for 15 minutes, and then treatment with carbonated water, and was observed with SEM. Corrosion was observed on the surface of the copper wiring material, which confirmed desorption of the adsorbed component.

Example 7

The substrate sample for evaluation was made in contact with 1% HF water at 25° C. for 60 seconds, then subjected to liquid contact treatment with a 1% by mass aqueous solution containing 30% by mass of ethyl alcohol of a 8 mol oxyethylene adduct of 2,4,7,9-tetramethyl-5-decyn-4,7-diol (total carbon number: 30) at 25° C. for 90 seconds, and then rinsed with extra pure water.

The sample was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1\times10^{-7}$ Pa and 400° C. for 10 minutes, and then treatment with carbonated water, and was observed with SEM. Corrosion was observed on the surface of the copper wiring material, which confirmed desorption of the adsorbed component.

Example 8

The substrate sample for evaluation was made in contact with 1% HF water at 25° C. for 60 seconds, and then rinsed with extra pure water. Thereafter, without blowing nitrogen, the sample was subjected to liquid contact treatment with a 1% by mass aqueous solution containing 60% by mass of dipropylene glycol monomethyl ether of a 4 mol oxyethylene adduct of 2,5,8,11-tetramethyl-6-dodecyn-5,8-diol (total carbon number: 24) at 25° C. for 120 seconds, and then rinsed with extra pure water.

The sample was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1\times10^{-7}$ Pa and 300° C. for 15 minutes, and then treatment with carbonated water, and was observed with SEM. Corrosion was observed on the surface of the copper wiring material, which confirmed desorption of the adsorbed component.

Example 9

The substrate sample for evaluation was subjected to liquid contact treatment with a 0.01% by mass aqueous solution containing 20% by mass of isopropanol of a 10 mol oxyethylene adduct of 2,4,7,9-tetramethyl-5-decyn-4,7-diol (total carbon number: 34) at 25° C. for 600 seconds, and then rinsed with extra pure water.

The sample was evaluated for corrosion with carbonated water as Evaluation 1, and no corrosion was observed on the surface of the copper wiring material.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1\times10^{-7}$ Pa and 200° C. for 15 minutes, and then treatment with carbonated water, and was observed with SEM. Corrosion was observed on the surface of the copper wiring material, which confirmed desorption of the adsorbed component.

Comparative Example 1

The substrate sample for evaluation was subjected to Evaluation 1 and Evaluation 2 without subjecting to the treatment with HF water for removing an oxide film on the surface of the copper wiring material and the liquid contact treatment.

In the evaluation of corrosion with carbonated water as Evaluation 1, corrosion was observed on the surface of the copper wiring material.

In the evaluation on exposure to high humidity as Evaluation 2, foreign matters were observed on the surface of the copper wiring material.

Evaluation 3 was not performed since no effect was obtained in Evaluation 1.

Comparative Example 2

The substrate sample for evaluation was immersed in 1% by mass HF water at 25° C. for 60 seconds for removing an oxide film on the surface of the copper wiring material, and rinsed with extra pure water, followed by drying by blowing nitrogen.

The sample was subjected to the evaluation of corrosion with carbonated water as Evaluation 1, and corrosion was observed on the surface of the copper wiring material.

The sample having been treated with 1% by mass HF water similarly and then dried was subjected to the evaluation on exposure to high humidity as Evaluation 2, and foreign matters were observed on the surface of the copper wiring material.

Evaluation 3 was not performed since no effect was obtained in Evaluation 1.

Comparative Example 3

The substrate sample for evaluation was subjected to liquid contact treatment by immersing in a 0.5% by mass iminodiacetic acid aqueous solution at 25° C. for 120 seconds, and rinsed with extra pure water.

The sample was subjected to the evaluation of corrosion with carbonated water as Evaluation 1, and corrosion was observed on the copper surface.

The sample having been subjected to the liquid contact treatment similarly and dried was subjected to the evaluation on exposure to high humidity as Evaluation 2, and no foreign matter was observed on the surface of the copper wiring material.

Evaluation 3 was not performed since no effect was obtained in Evaluation 1.

Comparative Example 4

The substrate sample for evaluation was subjected to liquid contact treatment by immersing in a 0.5% aqueous solution containing 20% by mass of isopropyl alcohol of 2,5-dimethyl-3-hexyn-2,5-diol at 25° C. for 120 seconds, and rinsed with extra pure water.

The sample was subjected to the evaluation of corrosion with carbonated water as Evaluation 1, and corrosion was observed on the surface of the copper wiring material.

The sample having been subjected to the liquid contact treatment similarly and blown with nitrogen was subjected to the evaluation on exposure to high humidity as Evaluation 2, and foreign matters were observed on the surface of the copper wiring material.

Evaluation 3 was not performed since no effect was obtained in Evaluation 1.

Comparative Example 5

The substrate sample for evaluation was subjected to liquid contact treatment by immersing in a 0.01% aqueous solution containing 30% by mass of ethyl alcohol of D-α-tocopherol at 25° C. for 120 seconds, and rinsed with extra pure water.

The sample was subjected to the evaluation of corrosion with carbonated water as Evaluation 1, and corrosion was observed on the copper surface.

The sample having been subjected to the liquid contact treatment similarly and blown with nitrogen was subjected to the evaluation on exposure to high humidity as Evaluation 2, and foreign matters were observed on the surface of the copper wiring material.

Evaluation 3 was not performed since no effect was obtained in Evaluation 1.

Comparative Example 6

The substrate sample for evaluation was subjected to liquid contact treatment by immersing in a 0.15% mercaptosuccinic acid aqueous solution at 25° C. for 120 seconds, and rinsed with extra pure water.

The sample was subjected to the evaluation of corrosion with carbonated water as Evaluation 1, and no corrosion was observed on the copper surface.

The sample having been subjected to the liquid contact treatment similarly and dried by blowing nitrogen was subjected to the evaluation on exposure to high humidity as Evaluation 2, and no foreign matter was observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1 \times 10^{-7}$ Pa and 200° C. for 10 minutes, and then treatment with carbonated water, and was observed with SEM. No corrosion was observed on the surface of the copper wiring material, and thus desorption of the adsorbed component was not confirmed.

Comparative Example 7

The substrate sample for evaluation was subjected to liquid contact treatment with HF water at 25° C. for 60 seconds, then rinsed with extra pure water. The sample was subjected to liquid contact treatment by immersing in a 0.15% 5-methyl-1H-benzotriazole aqueous solution at 25° C. for 120 seconds, and rinsed with extra pure water.

The sample was subjected to the evaluation of corrosion with carbonated water as Evaluation 1, and no corrosion was observed on the copper surface.

The sample having been subjected to the liquid contact treatment similarly and blown with nitrogen was subjected to the evaluation on exposure to high humidity as Evaluation 2, and foreign matters were observed on the surface of the copper wiring material.

For the evaluation of desorption of the adsorbed component as Evaluation 3, the sample having been subjected to the liquid contact treatment similarly and dried by blowing nitrogen was subjected to heat treatment at a reduced pressure of $1 \times 10^{-7}$ Pa and 200° C. for 10 minutes, and then treatment with carbonated water, and was observed with SEM. No corrosion was observed on the surface of the copper wiring material, and thus desorption of the adsorbed component was not confirmed.

The results of Examples 1 to 9 and Comparative Examples 1 to 7 are shown in Tables 1 and 2. It is found from Tables 1 and 2 that in Examples 1 to 9 where the present invention is applied, excellent in protective effect of the copper surface is obtained, and the adsorbed component is easily removed from the copper surface.

TABLE 1

| Example | Removal of spontaneous oxide film HF treatment | Oxyethylene adduct of acetylenediol Name of compound/total carbon number | Concentration (wt %) | Solvent Name of solvent | Concentration (wt %) |
|---|---|---|---|---|---|
| 1 | no | 10 mol oxyethylene adduct of 2,4,7,9-tetramethyl-5-decyn-4,7-diol/34 | 1.0 | none | — |
| 2 | done | 10 mol oxyethylene adduct of 2,4,7,9-tetramethyl-5-decyn-4,7-diol/34 | 0.1 | none | — |
| 3 | done | 4 mol oxyethylene adduct of 2,5,8,11-tetramethyl-6-dodecyn-5,8-diol/24 | 1.0 | isopropyl alcohol | 50 |
| 4 | no | 4 mol oxyethylene adduct of 2,5,8,11-tetramethyl-6-dodecyn-5,8-diol/24 | 0.08 | none | — |
| 5 | done | 4 mol oxyethylene adduct of 2,4,7,9-tetramethyl-5-decyn-4,7-diol/22 | 0.5 | methyl alcohol | 50 |
| 6 | no | 6 mol oxyethylene adduct of 2,4,7,9-tetramethyl-5-decyn-4,7-diol/26 | 0.5 | ethylene glycol | 70 |
| 7 | done | 8 mol oxyethylene adduct of 2,4,7,9-tetramethyl-5-decyn-4,7-diol/30 | 1.0 | ethyl alcohol | 30 |
| 8 | done | 4 mol oxyethylene adduct of 2,5,8,11-tetramethyl-6-dodecyn-5,8-diol/24 | 1.0 | dipropylene glycol monomethyl ether | 60 |
| 9 | no | 10 mol oxyethylene adduct of 2,4,7,9-tetramethyl-5-decyn-4,7-diol/34 | 0.01 | isopropyl alcohol | 20 |

| Example | Treating condition (° C./sec) | Evaluation 1 | Evaluation 2 | Evaluation 3 condition | Evaluation 3 |
|---|---|---|---|---|---|
| 1 | 25/120 | A | A | $1 \times 10^{-7}$ Pa, 300° C., 20 min | A |
| 2 | 25/150 | A | A | $1 \times 10^{-7}$ Pa, 250° C., 10 min | A |
| 3 | 25/180 | A | A | $1 \times 10^{-7}$ Pa, 350° C., 10 min | A |
| 4 | 25/600 | A | A | $1 \times 10^{-7}$ Pa, 400° C., 10 min | A |
| 5 | 25/120 | A | A | $1 \times 10^{-7}$ Pa, 350° C., 10 min | A |
| 6 | 25/150 | A | A | $1 \times 10^{-7}$ Pa, 300° C., 15 min | A |
| 7 | 25/90 | A | A | $1 \times 10^{-7}$ Pa, 400° C., 10 min | A |
| 8 | 25/120 | A | A | $1 \times 10^{-7}$ Pa, 300° C., 15 min | A |
| 9 | 25/600 | A | A | $1 \times 10^{-7}$ Pa, 200° C., 15 min | A |

TABLE 2

| Comparative Example | Removal of spontaneous oxide film HF treatment | Treatment Component | Treating Condition (° C./sec) | Evaluation 1 | Evaluation 2 | Evaluation 3 condition | Evaluation 3 |
|---|---|---|---|---|---|---|---|
| 1 | no | — | — | B | B | — | — |
| 2 | done | — | — | B | B | — | — |
| 3 | no | 0.5% by mass iminodiacetic acid | 25/120 | B | A | — | — |
| 4 | no | 0.5% by mass 2,5-dimethyl-3-hexyn-2,5-diol 20% by mass isopropyl alcohol | 25/120 | B | B | — | — |
| 5 | no | 0.01% by mass D-α-tocopherol 30% by mass ethyl alcohol | 25/120 | B | B | — | — |
| 6 | no | 0.15% by mass mercaplosuccinic acid | 25/120 | A | A | $1 \times 10^{-7}$ Pa, 200° C., 10 min | B |
| 7 | done | 0.15% by mass 5-methyl-1H-benzotriazole | 25/120 | A | B | $1 \times 10^{-7}$ Pa, 200° C., 10 min | B |

The invention claimed is:

1. A copper wiring material surface protective liquid comprising an oxyalkylene adduct of an acetylenediol comprising an acetylenediol having an oxyalkylene having 2 or 3 carbon atoms added thereto.

2. The copper wiring material surface protective liquid according to claim 1, wherein the acetylenediol is 2,4,7,9-tetramethyl-5-decyn-4,7-diol and/or 2,5,8,11-tetramethyl-6-dodecyn-5,8-diol.

3. The copper wiring material surface protective liquid according to claim 1, wherein a molar number of the oxyalkylene in the oxyalkylene adduct of an acetylenediol is from 1 to 10 mol.

4. The copper wiring material surface protective liquid according to claim 1, wherein the oxyalkylene of the oxyalkylene adduct of an acetylenediol is oxyethylene, and a total number of carbon atoms of the oxyalkylene adduct of an acetylenediol is from 16 to 34.

5. The copper wiring material surface protective liquid according to claim 1, which further comprises at least one kind of an alcohol compound and a glycol ether compound.

6. A method for producing a semiconductor circuit device, containing: forming an insulating film and/or a diffusion preventing film on a silicon substrate; then forming a copper film by a sputtering method; then forming a copper wiring containing 80% by mass or more of copper thereon by a plating method; and flattening the wiring by a chemical mechanical polishing (CMP) method, thereby providing a semiconductor substrate containing a copper wiring, the semiconductor substrate having an exposed surface of a copper wiring material being treated by making in contact with the copper wiring material surface protective liquid according to claim 1.

\* \* \* \* \*